United States Patent [19]
Homma

[11] Patent Number: 5,468,682
[45] Date of Patent: Nov. 21, 1995

[54] METHOD OF MANUFACTURING SEMICONDUCTOR DEVICE USING THE ABRASIVE

[75] Inventor: Tetsuya Homma, Tokyo, Japan

[73] Assignee: NEC Corporation, Tokyo, Japan

[21] Appl. No.: 355,008

[22] Filed: Dec. 13, 1994

[30] Foreign Application Priority Data

Dec. 21, 1993 [JP] Japan ................... 5-322516

[51] Int. Cl.⁶ .................................. H01L 21/463
[52] U.S. Cl. .................. 437/195; 437/225; 437/240; 156/645.1
[58] Field of Search ........................... 437/195, 225, 437/240; 148/DIG. 135; 156/645.1

[56] References Cited

U.S. PATENT DOCUMENTS

| | | | |
|---|---|---|---|
| 5,084,419 | 1/1992 | Sakao | 437/225 |
| 5,209,816 | 5/1993 | Yu et al. | 437/225 |
| 5,318,927 | 6/1994 | Sandhu et al. | 437/225 |
| 5,332,467 | 7/1994 | Sune et al. | 156/645 |
| 5,395,801 | 3/1995 | Doan et al. | 437/225 |
| 5,399,234 | 3/1995 | Yu et al. | 437/225 |
| 5,420,070 | 5/1995 | Matsuura et al. | 437/195 |

FOREIGN PATENT DOCUMENTS

| | | |
|---|---|---|
| 61-12034 | 1/1986 | Japan . |
| 62-20876 | 1/1987 | Japan . |
| 4-239750 | 8/1992 | Japan . |
| 4-360533 | 12/1992 | Japan . |

OTHER PUBLICATIONS

William J. Patrick et al., "Application of Chemical Mechanical . . . of VLSI Circuit Interconnections", *J. Electrochem. Soc.*, vol. 138, No. 6, Jun. 1991, pp. 1778–1784.

*Primary Examiner*—Brian F. Hearn
*Assistant Examiner*—Michael Trinh
*Attorney, Agent, or Firm*—Sughrue, Mion, Zinn, Macpeak & Seas

[57] ABSTRACT

Disclosed herein is abrasives consisting of fine particles of fluorinated silicon oxide which do not contain alkali metal and methods of thier manufacture, and high yield and high reliability methods of manufacturing semiconductor devices by the use of these abrasives. The abrasive comprises a solution in which fine particles of fluorinated silicon oxide are dispersed is formed by addition of boric acid to an aqueous solution of hydrosilicofluoric acid or addition of pure water to an alcohol solution of alkoxyfluorosilane. By the use of these abrasives, a layer insulating film for multilayer wiring can be flattened.

6 Claims, 6 Drawing Sheets

METHOD OF MANUFACTURING SEMICONDUCTOR DEVICE USING THE ABRASIVE

BACKGROUND OF THE INVENTION

1. Field of the Invention

The present invention relates to a method of manufacturing a semiconductor device and, more particularly, to such a method including a step for chemically and mechanically polishing a layer formed on a semiconductor substrate.

2. Description of the Related Art

Recently, a polishing step has become very important in a high integration density device. Heretofore, colloidal silica (particle diameter of 30 nm) stabilized by potasjum hydroxide (KOH) and diluted by pure water to pH of about 9.5 has been used as an abrasive for polishing especially the surface of a silicon oxide film, as disclosed in Journal of Electrochemical Society, Vol. 138, No. 6, pp.1778–1784 (1991). In this prior Specifically, as shown in FIGS. 6A and 6B, a first aluminum-copper (2% copper) wiring layer 602 is formed on a semiconductor substrate 601, followed by forming connection pillars 603 for connecting upper and lower wiring layers are formed on the first wiring layer 602. A silicon oxide film 604 is then formed by the biased sputtering method (FIG. 6A). Next, the silicon oxide film is polished using the abrasive until the surfaces of the connecting pillars 603 are revealed. Finally, a second aluminum-copper wiring 605 is formed, thus completing a two-layer wiring structure (FIG. 6B).

The abrasive, colloidal silica, used in the prior art described above is readily gelled when water is added, and it is difficult to use as it is as an abrasive. 10 Accordingly, potassium hydroxide is added for the purpose of preventing its gelation.

However, the polishing method utilizing the conventional abrasive has the following problems. Namely, the silicon oxide film 604 generally has a high hygroscopicity so that potassium hydroxide contained in the abrasive diffuses into the silicon oxide film 604. Although not shown in FIG. 6, a MOS transistor is formed in the substrate 601, and an alkali metal such as sodium or pottasium infiltrates into the gate oxide film of the MOS type transistor. The threshold voltage thereof thereby varies, which brings about deterioration of its transistor characteristics, and as a result, there is a problem in that deterioration of device characteristics and degradation of reliability are brought about. Moreover, colloidal silica fine particles in the abrasive remain stuck to the semiconductor substrate 601 after polishing, which gives rise to a problem that their removal is a difficult task.

Furthermore, a dried abrasive becomes a generating source of fine particles including those of an alkali metal, which brings about a problem of contaminating the clean room where cleanliness is a prerequisite, and deteriorates the yield of device production and the reliability of the devices.

SUMMARY OF THE INVENTION

It is therefore an object of the present invention to provide a method of manufacturing a semiconductor device having an improved polishing step.

It is another object of the present invention to provide a method of manufacturing a semiconductor device having a step of polishing an insulating film such as a silicon oxide film without deteriorating characteristics of the device.

According to one aspect of the present invention, there is provided an abrasive which is obtained by dispersing fluorinated silicon oxide fine particles in an aqueous solution or a solution containing alcohol.

Another aspect of this invention is in that the above abrasive is derived by forming fluorinated silicon oxide fine particles by dissolving water, aqueous solution of boric acid or a metal such as aluminum in an aqueous solution having hydrosilicofluoric acid ($H_2SiF_6$) as the main component, or by forming fluorinated silicon oxide fine particles by adding pure water to a solution having alkoxyfluorosilane (general formula $F_nSi(OR)_{4-n}$, where n is 1, 2 or 3 and R is an alkyl group) as the main component.

According to a still another aspect of this invention, there is provide a method of manufacturing a semiconductor device comprising the steps of forming a first wiring layer on a semiconductor substrate via an insulating film, forming a part of a layer insulating film having silicon oxide as the main component, polishing the surface of the layer insulating film by using an abrasive containing the fluorinated silicon oxide fine particles, forming a silicon oxide film, and forming a second wiring layer.

It is convenient that, during the step of polishing the surface of the layer insulating film, polishing is performed while continuously dissolving pure water or boric acid or aluminum or the like into an aqueous solution containing hydrosilicofluoric acid as the main component.

It is further convenient that, during the step of polishing the surface of the layer insulating film in the first method of manufacturing a semiconductor device, polishing is performed while continuously adding pure water or alcohol containing pure water to a solution having alkoxyfluorosilane as the main component.

BRIEF DESCRIPTION OF THE DRAWINGS

The above-mentioned and other objects, features and advantages of this invention will become more apparent by reference to the following detailed description of the invention taken in conjunction with the accompanying drawings, wherein.

DETAILED DESCRIPTION OF THE INVENTION

Figure 1A:
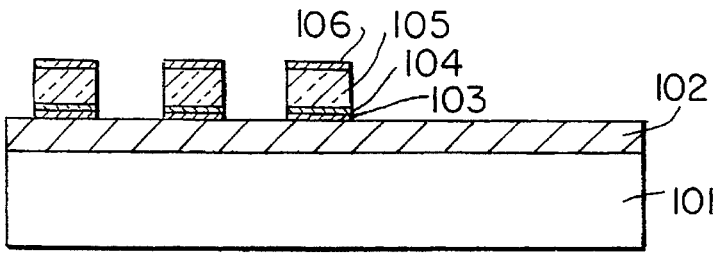
FIGS. 1A to 1F are sectional views illustrating a method of manufacturing a semiconductor device according to an embodiment of this invention.

Before described embodiments of the invention, an abrasive employed in this invention will be described.

First, an abrasive formed by using hydrosilicofluoric acid and its manufacturing method will be described as a first example of this invention.

The abrasive of this example is one obtained by dispersing fine particles represented by the composition $SiO_{2-x}F_x$ ($0<x<2$) and having a mean particle diameter of about 30 nm in an aqueous solution of about 40 wt % of hydrosilicofluoric acid so as to have the density in solution of about 5000 particles/cm$^3$. The parameter x in the above composition takes on a value in the range of O to 2, but it is preferable that it satisfies $0.1< x<0.5$. The composition of fluorinated silicon oxide formed in this embodiment was $SiO_{1.85}F_{0.15}$.

The abrasive of this example can be manufactured by the following method. Fine particles of fluorinated silicon oxide are precipitated by adding 110g of aqueous solucution of 0.5 mol/l boric acid ($H_3BO_3$) to 20 kg of aqueous solution of hydrosilicofluoric acid of about 40 wt. %, and stirring the mixture at 25° C. for 24 hours. Following that, filtration is repeated for three times by using a teflon-made 0.11 µm filter. In this way an abrasive material with dispersed fluorinated silicon oxide fine particles can be obtained. Here, the formation of a silicon oxide film by the reactions of hydrosilicofluoric acid and boric acid is disclosed in detail in, for example, Japanese Laid-Open Patent Publication No. Sho 61-12034, according to which it can be described in terms of the chemical reactions in Eqs. (1) and (2) given below:

$$H_2SiF_6+2H_2O \rightarrow 6HF+SiO_2 \quad (1)$$

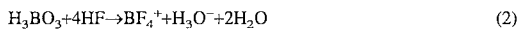
$$H_3BO_3+4HF \rightarrow BF_4^-+H_3O^-+2H_2O \quad (2)$$

That a similar result, namely, the formation of a filmlike silicon oxide, can be obtained by the reactions of hydrosilicofluoric acid and metallic aluminum or an aluminum compound has been disclosed in detail in Japanese Laid-Open Patent Publication No. Sho62-20876. However, this laid-open patent is for the purpose of forming a filmlike silicon oxide so that its aim differs very much from the object of the present invention.

Besides the method of this example, the abrasive material can also be formed by dispersing fluorinated silicon oxide fine particless formed by adding pure water or metallic aluminum, in place of boric acid. Further, compositions other than the composition of fluorinated silicon oxide of this embodiment may be used, and the concentrations of hydrosilicofluoric acid and boric acid may be different from those of this embodiment.

Next, an abrasive formed by using alkoxyfluorosilane and its method of manufacture will be described as a second example.

The abrasive of this example is obtained by dispersing fine particles with composition represented by $SiO_{2-x}F_x$ ($0<x<2$) and having a mean particle diameter of about 25 nm so as to have the density in solution of 3000 particles/cm$^3$. The value of x is preferred to satisfy the condition $0.1<x<0.5$. The composition of this embodiment was $SiO_{1.88}F_{0.12}$.

The abrasive according to this example can be manufactured by the following method. Fluorinated silicon oxide fine particles are precipitated by adding 500 g of pure water to 10 kg of ethyl alcohol solution containing about 20 wt. % of triethoxyfluorosilane ($FSi(OC_2H_5)_3$) and stirring the mixture at 25° C. for 24 hours. The chemical reactions involved in the manufacture are shown in Eqs. (3) and (4)

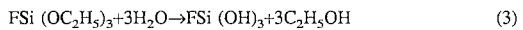
$$FSi(OC_2H_5)_3+3H_2O \rightarrow FSi(OH)_3+3C_2H_5OH \quad (3)$$

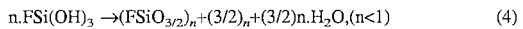
$$n.FSi(OH)_3 \rightarrow (FSiO_{3/2})_n+(3/2)_n+(3/2)n.H_2O, (n<1) \quad (4)$$

Following this, filtration is repeated for three times a 0.1 µm teflon-made filter, similar to the embodiment 1. In this way an abrasive with dispersed fluorinated silicon oxide fine particles can be formed.

Referring now the drawings, a method of manufacturing a device according to this invention will be described.

FIG. 1 indicates the respective steps for manufacturing a semiconductor device having a two-layer wiring structure.

First, as shown in FIG. 1A, a titanium film 103 with thickness of about 0.1 µm, a first titanium nitride film 104 with thickness of about 0.1 µm, a first aluminum film 105 containing copper and silicon with thickness of about 0.6 µm and a second titanium nitride film 106 with thickness of about 0.05 µm are formed sequentially on a boraphosphosilicate glass (BPSG) film 102 covering a silicon substrate 101. The BPSG film 102 has a thickness of about 0.8 µm and contains phosphorus and boron. Then, a first wiring layer is formed by patterning using photolithography.

Figure 1B:
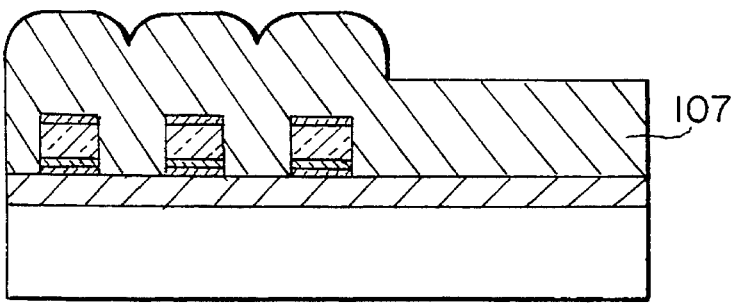
Figure 1C:
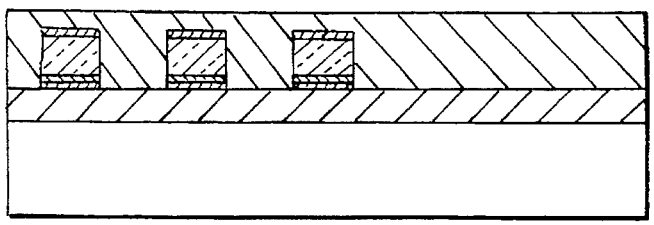

Next, as shown in FIG. 1B, a first silicon oxide film 107 with thickness of about 1.5 µm is formed by plasma chemical vapor deposition. Following that, the surface is polished by chemical and mechanical polishing method until the thickness of the silicon oxide film on the wiring is reduced to 0.3 µm, as shown in FIG. 1C. In this embodiment, the abrasive in which fluorinated silicon oxide fine particles of mean particle diameter about 30 nm are dispersed in hydrosilicofluoric acid solution, as described in the first example, is used as the abrasive.

Figure 2A:
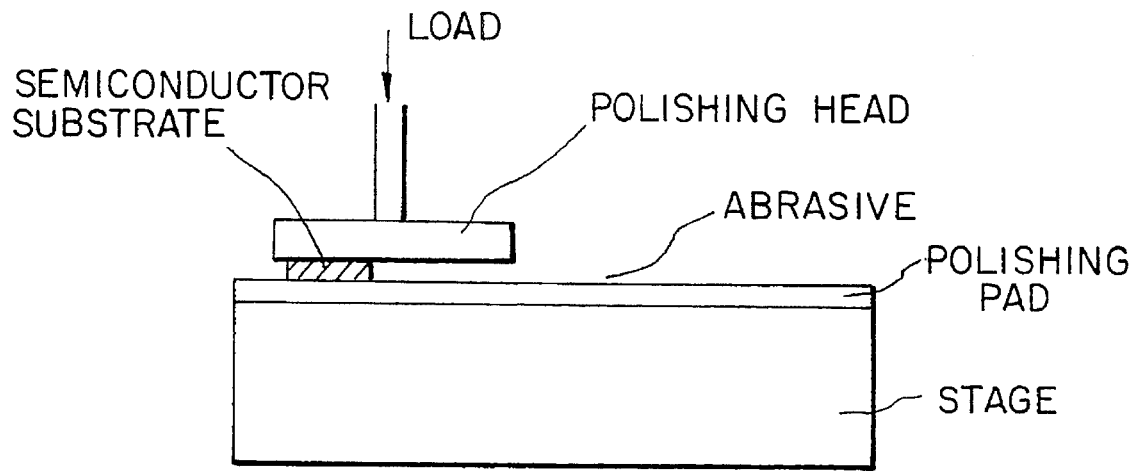
FIGS. 2A and 2B are cross-sectional and plan views illustrative of a polishing device used in this invention.
Figure 2B:
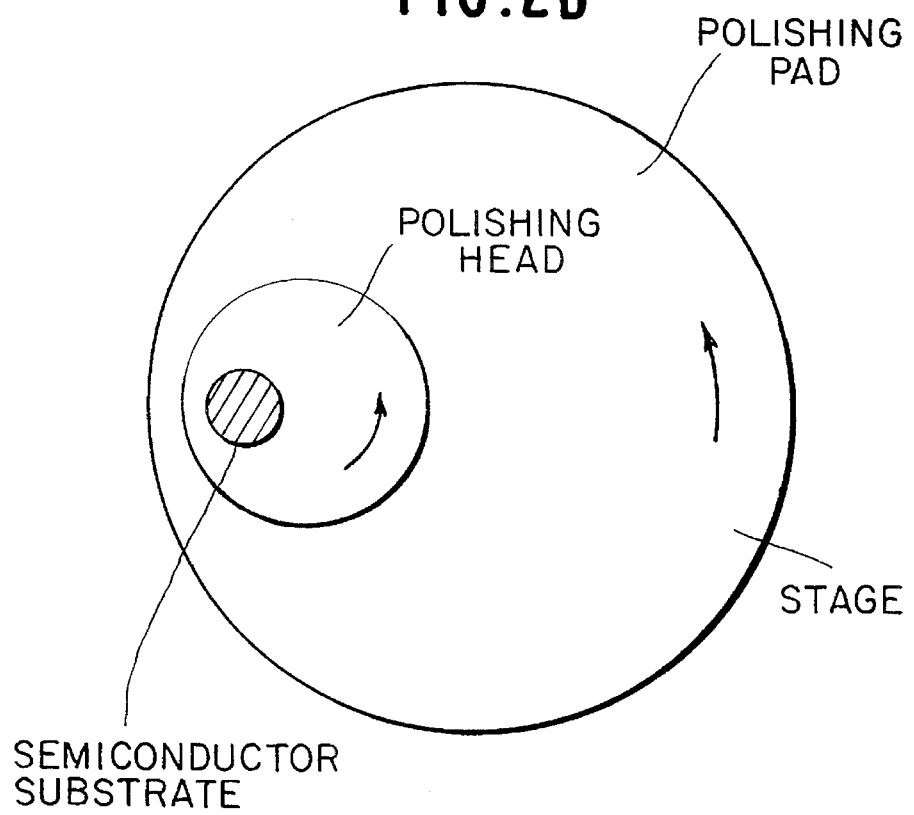

A schematic view of the polishing device used in this embodiment is shown in FIGS. 2A and 2B. This device is constituted of a polishing pad made of polyurethane bonded to a stage and a polishing head which sucks a semiconductor substrate (substrate to be polished), where a load can be applied to the polishing head. Further, the device is provided with a function to give independent rotations to the polishing pad and the polishing head. The conditions of polishing employed in this embodiment were as follows: The rotational speeds of the polishing pad and the polishing head were 50 and 100 rotations/min, respectively, the applied load was 20 psi, and the feeding amount of the abrasive was 5 cc/sec. The polishing rate under these conditions was 300 mm/min which is large compared with the conventional polishing rate (150 to 200 nm/min). After polishing for 3 min under these conditions, the substrate was washed with shower of water to remove the remaining abrasive. With the polishing process as in the above, the surface of the silicon oxide film with much ruggedness is flattened as shown in FIG. 1C.

Figure 1D:
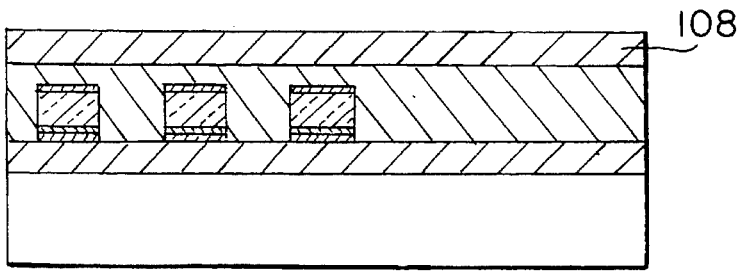
Figure 1E:
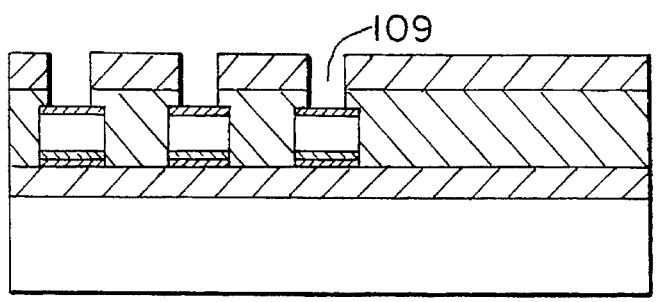
Figure 1F:
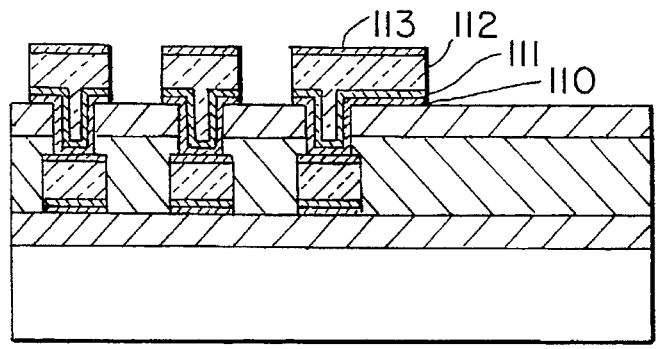

Subsequently, as shown in FIG. 1D, a second silicon oxide film 108 with thickness of about 0.5 µm is formed by plasma chemical vapor deposition. Next, through holes 109 are formed as shown in FIG. 1E employing photolithography technique. Then, as shown in FIG. 1F, a second titanium film 110 with thickness of about 0.1 µm, a third titanium nitride film 111 with thickness of about 0.1 µm, a copper and silicon containing second aluminum film 112 with thickness of about 0.6 µm, and a fourth titanium nitride film 113 with thickness of about 0.05 µm are formed sequentially by sputtering, and a second wiring layer is formed by patterning using photolithography technique.

In the semiconductor device having a two-layer wiring structure formed in the above, the surface of the layer insulating film between the first and the second wiring layers is perfectly flat substantially, so that the upper wiring layer with line width of 0.5 µm and spacing of 0.5 µm was absolutely free from short-circuiting and disconnection. Moreover, the connection resistance at the through hole with diameter of 0.6 μm was a sufficiently small value of 0.4 Ω. Further, the number of fine particles of the abrasive remaining on the surface of the silicon oxide film formed by plasma chemical vapor deposition immediately after polishing was about 20.000 on the average per semiconductor substrate with 6-inch diameter, but the number was reduced to less than 100 after washing with water shower. This represents a number which is one order of magnitude smaller than the number of fine particles (about 1000) after polishing with the conventional abrasive and washing with water shower.

Next, a second embodiment of this invention will be described. In this embodiment, the basic device structure is the same as that shown in FIG. 1, but the abrasive employed therein is obtained by dispersing, in ethyl alcohol, fluorinated silicon oxide fine particles formed by the use of triethoxyfluorosilane.

More specifically, after the first silicon oxide film 107 is formed by plasma chemical vapor deposition as shown in FIG. 1(B), the silicon oxide film 107 on 10 the wiring layer is polished by chemical and mechanical polishing until the film thickness is reduced to 0.3 μm, as shown in FIG. 1C. The polishing conditions at this embodiment are as follows: The rotational speed of both the polishing pad and the polishing head was 100 rotations/min, the load was 30 psi, and the feeding amount of the abrasive was 10 cc/sec. The polishing rate in this case was about 250 nm/min. After polishing for four minutes under these conditions, the sample was cleaned in ethyl alcohol, then washed with shower of water. Here, the number of abrasive fine particles remaining on the surface of the semiconductor substrate with 6-inch diameter was less than 100.

Subsequently, the second silicon oxide film 108 with thickness of about 0.5 μm is formed by plasma chemical vapor deposition by a process similar to that of the third embodiment as shown in FIG. 1D, then through holes 109 are formed as shown in FIG. 1E. Finally, a second wiring layer is formed in a manner similar to the above embodiment. The two-layer wiring structure formed in this way showed characteristics similar to those of the third embodiment.

Turning to FIG. 3, there is shown another embodiment according to this invention which is applied to flattening of a layer insulating film below aluminum wirings of a DRAM.

Figure 3A:
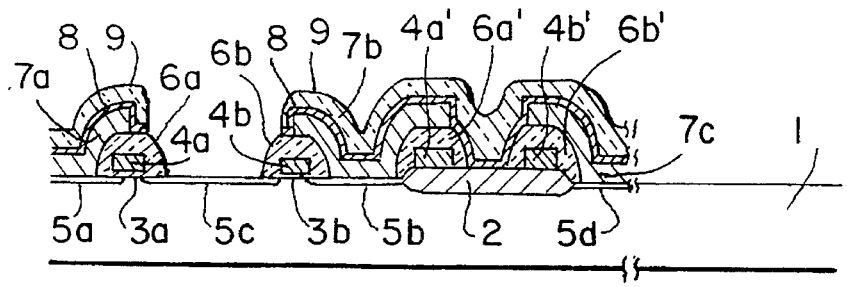
FIGS. 3A to 3F are sectional views illustrating a method of manufacturing a DRAM according to another embodiment of this invention.

More specifically, as shown in FIG. 3A, an element isolation region 2 with thickness of about 0.4 μm is formed in a prescribed region on the surface of a silicon substrate 1 by the so-called LOCOS method. Next, gate oxide films 3a and 3b with thickness of about 15 nm are formed by thermal oxidation. Following that, a polycrystalline silicon film with thickness of about 0.3 μm containing phosphorus, and a silicon oxide film are formed by low pressure chemical vapor deposition (CVD) method, and by patterning them, gate electrodes 4a and 4b, and word lines 4a' and 4b' having silicon oxide film on top of them are formed. Next, impurity diffused layers 5a, 5b, 5c and 5d are formed on the surface of the semiconductor substrate 1 by implanting phosphorus ions. Then, a silicon oxide film with thickness of about 0.3 μm is formed allover the surface by low pressure CVD method, and the silicon oxide film is removed selectively by an anisotropic etching method to cover the gate electrodes and the word lines with silicon oxide films 6a and 6b, and 6a' and 6b', respectively. Next, lower electrodes 7a, 7b and 7c, of a capacitor part consisting of a polycrystalline silicon film with thickness of about 0.4 μm are formed by low pressure CVD method. Then, after forming a silicon nitride film with thickness of about 100 nm allover the surface, a part of the silicon nitride film is oxidized by thermal oxidation to form a capacitor insulating film 8. Following that, after forming a polycrystalline silicon film with thickness of about 0.3 μm allover the surface, the polycrystalline silicon film is removed except for prescribed regions to form an upper electrode 9 of the capacitor part.

Figure 3B:
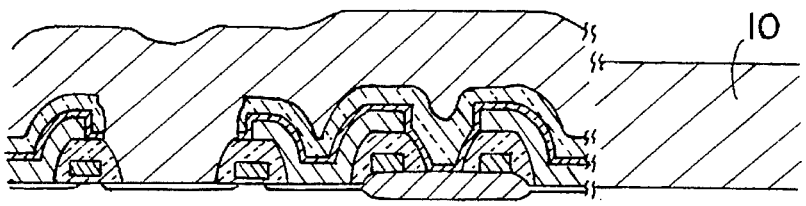
Figure 3C:
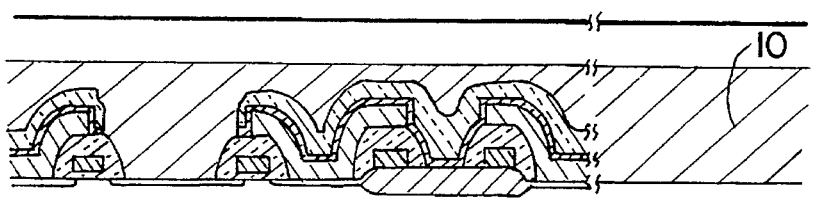

Next, as shown in FIG. 3B, after forming a silicon oxide film containing a BPSG film 10 with thickness of about 1.5 μm, the substrate is subjected to reflow in an $N_2$ atmosphere at 850° C. Then, the BPSG film is flattened by chemical and mechanical polishing as shown in FIG. 3C.

In this embodiment, the abrasive of the first embodiment, obtained by dispersing fluorinated silicon oxide fine particles with means particle diameter of about 30 nm in an aqueous solution of hydrosilicofluoric acid, was used as the abrasive. The polishing conditions were as follows. The rotational speed of both the polishing pad and the polishing head was 100 rotations/min, the load applied was 50 psi and the feeding amount of the abrasive was 5 cc/sec. In this case the polishing rate of the BPSG film was about 200 nm/min. After polishing for three minutes under these conditions, the sample was washed with shower of water to remove the remaining abrasive.

Figure 3D:
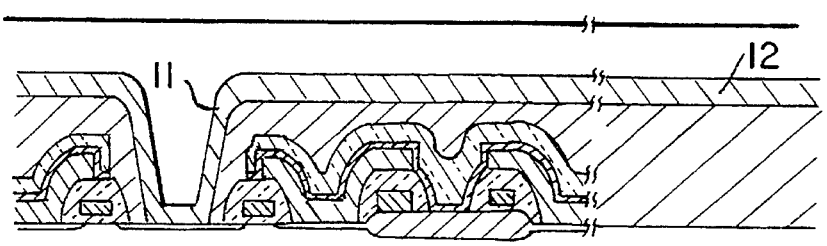

Next, as shown in FIG. 3D, a contact hole 11 is formed. Next, after forming a polycrystalline silicon film with thickness of about 0.1 μm by low pressure CVD method, a tungsten silicide film with thickness of about 0.1 μm is formed by sputtering. Then, a bit line 12 is formed by patterning using photolithography technique.

Figure 3E:
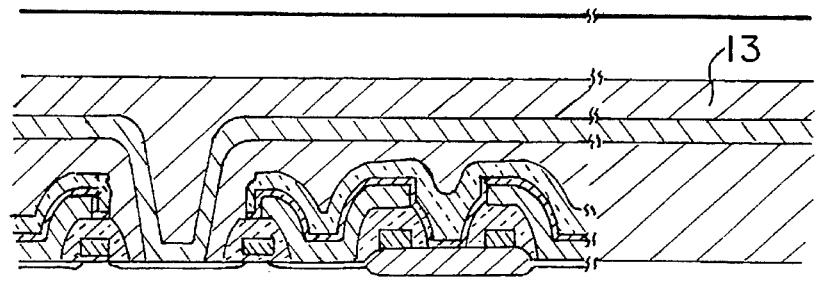

Further, as shown in FIG. 3E, after forming a BPSG film with thickness of about 1 μm by low pressure CVD method, the sample is subjected to reflow by heat treatment in an $N_2$ atmosphere at 850° C. Then, a flattened BPSG film 13 is formed by polishing it for two minutes by the above-mentioned polishing method.

Figure 3F:
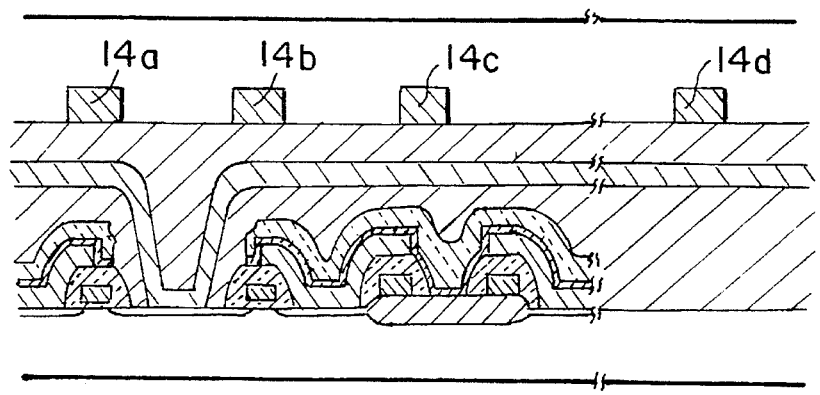

Finally, as shown in FIG. 3F, aluminum wirings 14a, 4b, 14c and 14d with thickness of about 0.6 μm are formed.

By the processes in the above, flattening of the film below the aluminum wirings of the DRAM becomes possible.

In this embodiment, there is normally an absolute level difference of 1.2 to 1.5 μm between the element formation region and the field region. By the use of the abrasive according to this invention it is possible to completely eliminate the absolute level difference. In addition, in this embodiment, the fluctuations of the threshold voltage of a MOS transistor for checking the characteristics formed on the same semiconductor substrate, was investigated. As a result of a bias-temperature test at 5 V and 150° C., the fluctuations of the threshold voltage after a test for 1000 hours were within 2% which is small compared with the threshold voltage fluctuations (7 to 10%) when the conventional abrasive is used. This is because no alkali metal is contained in the abrasive of this invention.

Next, referring to the drawings, yet another embodiment of this invention will be described.

In this embodiment, an example of polishing a silicon oxide film while continuously forming fine particles of fluorinated silicon oxide by the simultaneous use of hydrosilicofluoric acid aqueous solution and boric acid aqueous solution will be described.

Figure 4A:
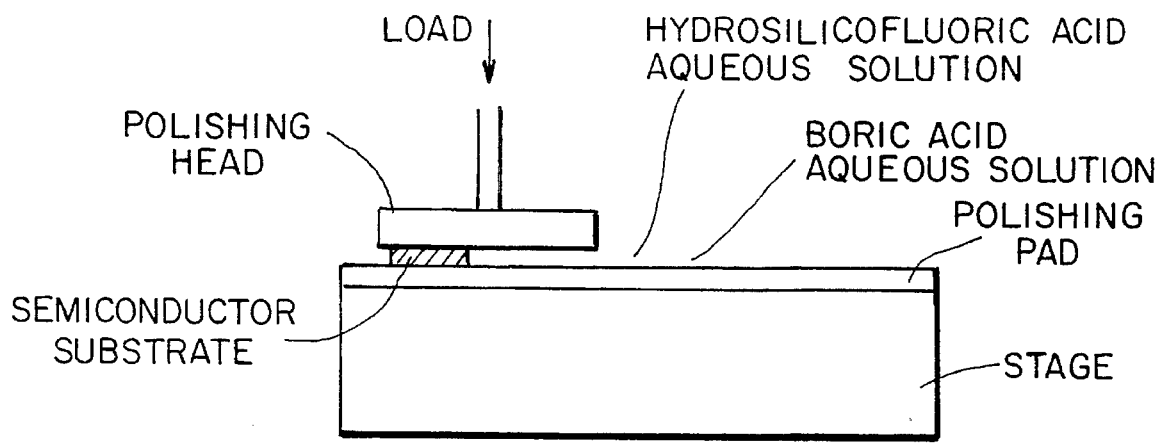
FIGS. 4A and 4B are cross-sectional views indicative of polishing methods according to embodiments of this invention.

The polishing of the surface of a silicon oxide film having microroughness formed on the surface of a semiconductor substrate was performed employing the method shown in FIG. 4A. Namely, the polishing is carried out by pouring simultaneously an aqueous solution containing about 40 wt. % of hydrosilicofluoric acid and an aqueous solution of boric acid with concentration of about 0.1 mol/l into the space between the semiconductor substrate and the polishing pad of the polishing device, and letting fluorinated silicon oxide fine particles precipitate continuously. In this case, the rotational speeds of the polishing pad and the polishing head were set to be 50 and 100 rotations/min, respectively, and the load applied was chosen to be 30 psi. Further, the feeding amounts of the hydrosilicofluoric acid aqueous solution and the boric acid aqueous solution were chosen to be 10 and 1 cc/sec, respectively. The polishing rate of the silicon oxide film under these conditions was about 350 nm/min, and the surface of the silicon oxide film was flattened by substantially complete elimination in about 3 min of the microroughness with maximum height difference of about 1 μm.

Next, referring to the drawings, still another embodiment of this invention will be described.

In this embodiment, an example of polishing a silicon oxide film by inducing continuous precipitation of the fluorinated silicon oxide fine particles through the simultaneous introduction of pure water and an ethyl alcohol solution of triethoxyfluorosilane, will be described.

Figure 4B:
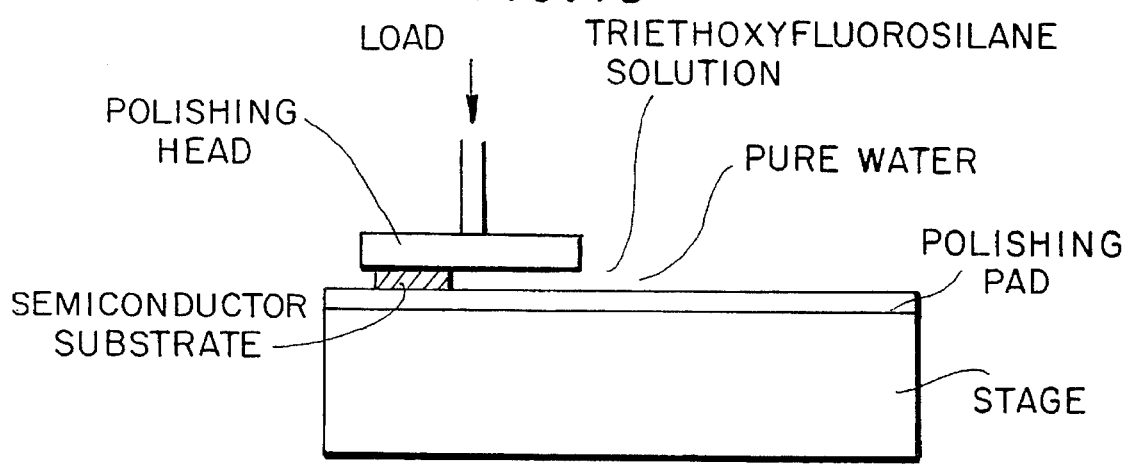

The polishing of the surface of a silicon oxide film having a microroughness formed on a semiconductor substrate was carried out by the method shown in FIG. 4B. The polishing is carried out by inducing continuous precipitation of fluorinated silicon oxide fine particles through pouring of pure water and an ethyl alcohol solution of about 30 wt. % triethoxyfluorosilane into the space between the semiconductor substrate and the polishing pad of the polishing device. In this case, the rotational speeds of the polishing pad and the polishing head were set to be 70 and 100 rotations/min, and the load applied was set to be 25 psi. In addition, the feeding amounts of pure water and the ethyl alcohol solution of triethoxyfluorosilane were set to be both equal to 5 cc/sec.

The polishing rate of the silicon oxide film under these conditions was about 250 nm/min, and the surface of the silicon oxide film was flattened after polishing of about four minutes with nearly complete elimination of microroughness of up to 1 μm.

Turning now to FIG. 5, there is shown the method of manufacture of a semiconductor device having a two-layer aluminum wiring structure according to a further embodiment of this invention.

Figure 5A:
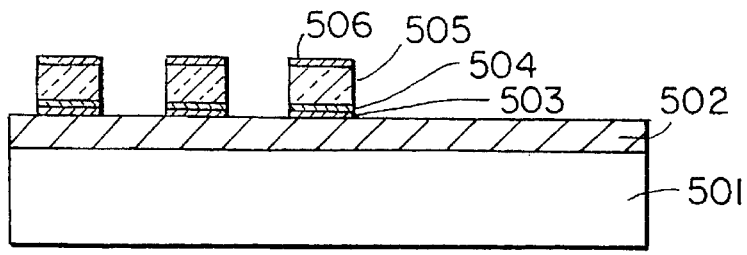
FIGS. 5A to 5F are sectional views illustrating a method of manufacturing a semiconductor device according to still another embodiment of this invention.
Figure 5B:
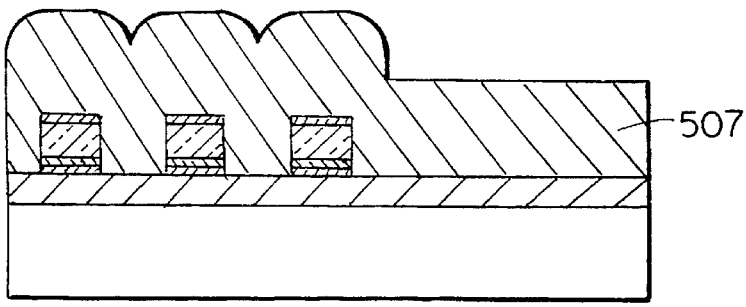

First, as shown in FIG. 5A, a first wiring layer consisting of a first titanium film 503 with thickness of about 0.1 μm, a titanium nitride film 504 with thickness of about 0.1 μm, a first aluminum film 505 containing copper and silicon with thickness of about 0.6 μm, and a second titanium nitride film 506 with thickness of about 0.05 μm are formed in processes similar to those of the third embodiment. Next, as shown in FIG. 5B, a fluorinated silicon oxide film 507 with thickness of about 2 μm is formed. Here, the fluorinated silicon oxide film may be formed by a chemical vapor deposition method which uses trialkoxyfluorosilane ($FSi(OR)_3$ where R is an alkyl group) gas as disclosed in Japanese Patent Unexamined Application Publication No. Hei 4-239750. or Japanese Patent Unexamined Application Publication No. Hei 4-360533.

In this embodiment, the fluorinated silicon oxide film was formed by plasma chemical vapor deposition which uses triethoxyfluorosilane gas and oxygen gas. The flow rates of the triethoxyfluorosilane gas and the oxygen gas were set to be 50 and 200 sccm, respectively, and the pressure within the reaction chamber was set to be 10 Torr. The triethoxyfluorosilane gas was obtained from liquid triethoxyfluorosilane by heating it to 40° C. The substrate temperature was set to be 200° C., and the high frequency (1 MHz) power was set to be 500 W. The deposition rate of the fluorinated silicon oxide film was about 0.5 μm/min.

Figure 5C:
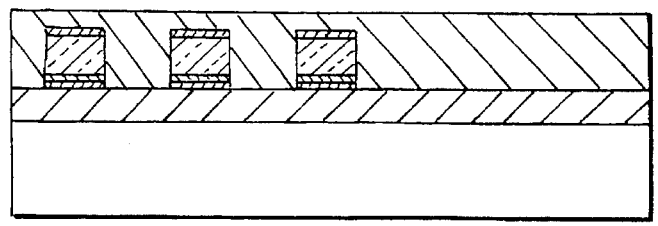

Next, as shown in FIG. 5C, the oxide silicon film on the wiring is polished by a chemical and mechanical polishing method until the thickness of the film is reduced to 0.3 μm.

In this embodiment, an abrasive described in the second embodiment in which fluorinated silicon oxide fine particles formed by using triethoxyfluorosilane are dispersed in ethyl alcohol, was used. The conditions of polishing were the same as those of the fourth embodiment, namely, the rotational speed of both the polishing pad and the polishing head was 100 rotations/min, the load applied was 30 psi and the feeding amount of the abrasive was 10 cc/sec. The polishing rate in this case was about 500 nm/min. After polishing for two minutes under these conditions, the sample was cleaned in ethyl alcohol, then washed with shower of water. At this time, the number of abrasive fine particles remaining on the surface of the semiconductor substrate was less than 50. Thus, it was confirmed that the polishing rate, and hence also the processing capability, was improved to about twice that of the embodiments in the above.

Figure 5D:
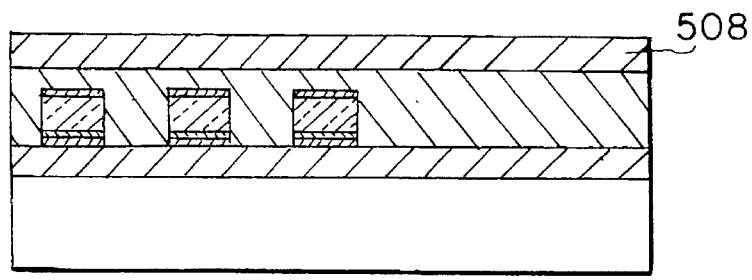
Figure 5E:
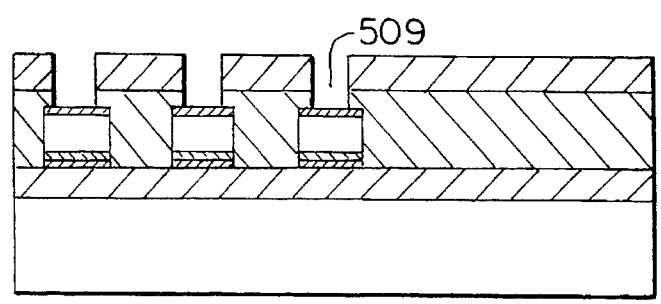
Figure 5F:
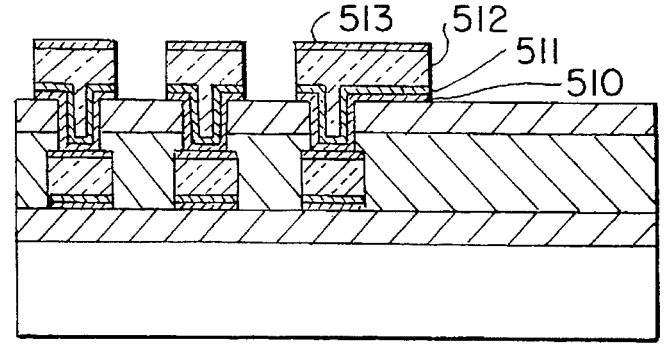
Figure 6A:
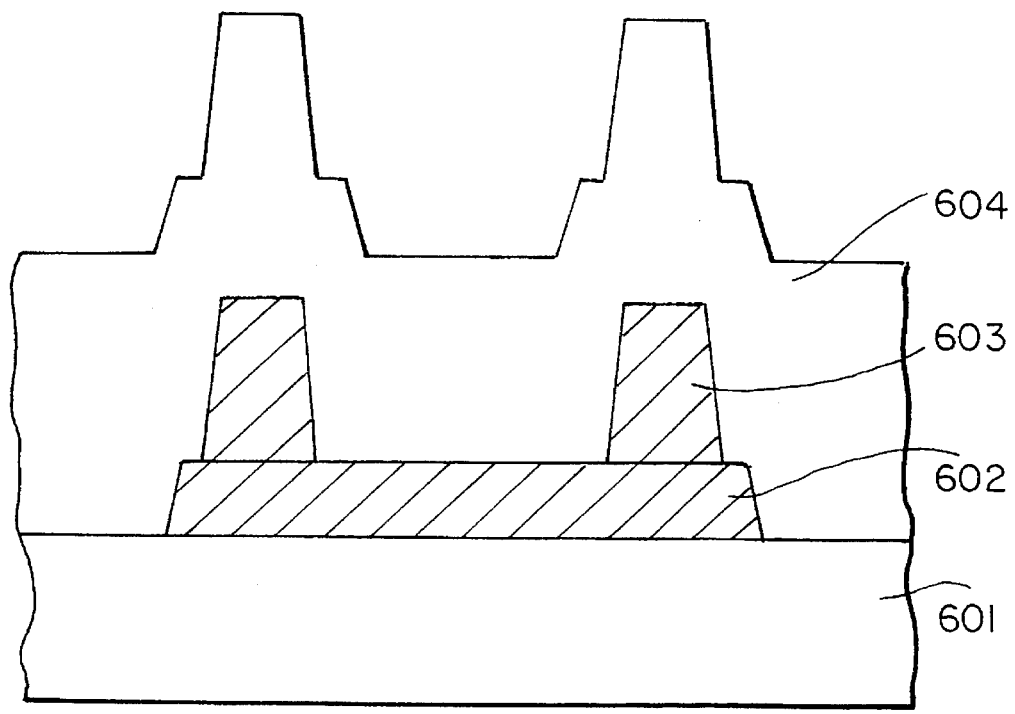
FIGS. 6A and 6B are sectional views illustrative of a prior art method.
Figure 6B:
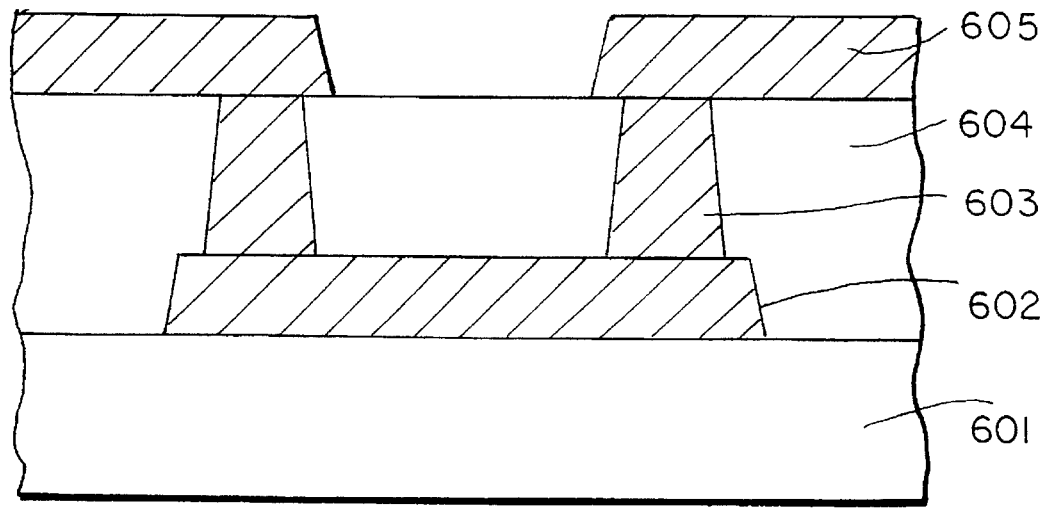

Following that, after forming a silicon oxide film with thickness of about 0.5 μm by plasma chemical vapor deposition as shown in FIG. 5D, according to a process similar to that for the third embodiment, through holes 509 are formed as shown in FIG. 5E. Finally, as shown in FIG. 5F, a second wiring layer is formed. The formed two-layer wiring structure showed characteristics similar to those of the third embodiment.

It is to be noted that the concentration of the hydrosilicofluoric acid aqueous solution, the concentration of the boric acid aqueous solution and the concentration of triethoxyfluorosilane in ethyl alcohol employed in the first to the eight embodiments may be different from those of this embodiment, and the conditions employed for the polishing may be different from those of this embodiment, too.

In addition, triethoxyfluorosilane used as an alkoxyfluorosilane in the second, fourth, seven and eighth embodiments may be replaced by other alkoxyfluorosilane such as triethoxyfluorosilane, tripropoxyfluorosilane, tributoxyfluorosilane or the like, and ethyl alcohol used as the solvent may be replaced by alcohol such as methyl alcohol, propyl alcohol, butyl alcohol or the like or another organic solvent.

Moreover, this invention can also be applied to multilayer wiring structures of three or more layers.

Further, in the third, fourth and eighth embodiments, a laminated wiring with the structure of titanium nitride film/aluminum film containing copper and silicon/titanium nitride film/titanium film has been used, but this invention is also applicable to a single layer or multi-layer wiring using other materials. Furthermore, in the third and fourth embodiments, a silicon oxide film formed by plasma chemical vapor deposition has been used as the layer insulating film. However, in may be replaced by a silicon oxide film formed by a method of thermochemical vapor deposition, chemical vapor deposition utilizing electron cyclotron resonance, chemical vapor deposition utilizing an organic source gas and ozone, sputtering, liquid crystal growth or a combination of some of these methods, or may be replaced by one formed in combination with partial flattening by a spin on glass film or partial flattening by etchback.

Still further, in the eighth embodiment, the fluorinated silicon oxide film is formed by plasma chemical vapor deposition using triethoxyfluorosilane gas and oxygen gas. Besides this method, however, at least one of a liquid phase growth method which utilizes a supersaturated solution of hydrosilicofluoric acid and a method of treating a spin on glass film using the vapor of alkoxyfluorosilane may be employed.

As described in the above, by the use of an abrasive in which fluorinated silicon oxide fine particles which do not contain atoms of an alkali metal are dispersed, the following effects can be obtained. First, by mixing fluorine in silicon oxide of the abrasive, the chemical effect, that is, the chemical etching effect, can be augmented at the time of polishing the silicon oxide film. This improves the polishing rate and enables surface flattening by polishing in shorter time, which contributes to the enhancement of productivity and reliability of semiconductor devices. In addition, by virtue of fluorine contained in the fine particles of the abrasive, the surface energy of the fine particles of the abrasive can be lowered, which reduces the adsorbed amount of the fine particles to the surface of the semiconductor substrate. Therefore, it has the effect of drastically reducing the amount of the fine particles remaining on the surface, improving the production yield. Moreover, the polishing rate can be improved by the use of the fluorinated silicon oxide film instead of the silicon oxide film, which contributes to the improvement of the processing capability.

Furthermore, as a result of the fact that the fluctuations of the threshold voltage of a MOS transistor can be suppressed due to inclusion of no alkali metal in the abrasive, this invention has the effect that the production yield of MOS devices can be improved and the manufacture of semiconductor devices of high reliability with less fluctuations of characteristics becomes possible. Therefore, this invention has an enormous effect on semiconductor devices and their manufacture.

Although the invention has been described with reference to specific embodiments, this description is not meant to be construed in a limiting sense. Various modifications of the disclosed embodiments, as well as other embodiments of the invention, will become apparent to persons skilled in the art upon reference to the description of the invention. It is therefore contemplated that the appended claims will cover any modifications or embodiments as fall within the true scope of the invention.

What is claimed is:

1. A method of manufacturing a semiconductor device comprising the steps of: forming a first wiring layer on an insulating film covering a semiconductor substrate, forming an interlayer insulating film having a silicon oxide film to cover said first wiring layer and said insulating film, and polishing said interlayer insulating film by use of an abrasive containing fine particles of fluorinated silicon oxide to thereby make a surface of said interlayer insulating film even.

2. The method as claimed in claim 1, where, said step of polishing said interlayer insulating film is performed while continuously dissolving at least one of pure water, aqueous solution of boric acid and aluminum into an aqueous solution having hydrosilicofluoric acid ($H_2SiF_6$).

3. The method as claimed in claim 1, where said step of polishing said interlayer insulating film is performed while continuously adding at least one of pure water and alcohol to a solution having alkoxyfluorosilane (general formula $F_nSi(OR)_{4-n}$ where n is 1 or 2 or 3 and R is an alkoxy group).

4. The method as claimed in claim 1, wherein said interlayer insulating film is formed by employing at least one of the methods selected from a thermochemical vapor deposition method, plasma chemical vapor deposition method, chemical vapor deposition method using electron cyclotron resonance (ECR), thermochemical vapor deposition method using an organic source gas and ozone, sputtering method, and liquid phase growth method.

5. The method as claimed in claim 1, wherein said interlayer insulating film includes a silicon oxide film containing fluorine.

6. The method as claimed in claim 5, wherein said silicon oxide film containing fluorine is formed by at least one of a chemical vapor deposition method which uses alkoxyfluorosilane ($F_4Si(OR)_{4-n}$ where n is 1 or 2 or 3 and R is an alkoxy group) gas, liquid phase growth method which uses supersaturated aqueous solution of hydrosilicofluoric acid and a method in which a spin on glass film treated by the alkoxyfluorosilane vapor is used.

* * * * *

UNITED STATES PATENT AND TRADEMARK OFFICE
CERTIFICATE OF CORRECTION

PATENT : 5,468,682
DATED : November 21, 1995
INVENTOR(S) : Tetsuya HOMMA

It is certified that error appears in the above-identified patent and that said Letters Patent is hereby corrected as shown below:

Column 3, line 67, delete "$+(3/2)_n$".

Column 4, line 10, delete "$\mu um$" and insert --$\mu m$--.

Column 5, line 19, delete "10".

Column 8, line 52, delete "in" and insert --it--.

Signed and Sealed this

First Day of October, 1996

Attest:

BRUCE LEHMAN

Attesting Officer          Commissioner of Patents and Trademarks